United States Patent
Cook et al.

(10) Patent No.: US 10,497,651 B2
(45) Date of Patent: Dec. 3, 2019

(54) ELECTROMAGNETIC INTERFERENCE SHIELD WITHIN INTEGRATED CIRCUIT ENCAPSULATION USING PHOTONIC BANDGAP STRUCTURE

(71) Applicant: Texas Instruments Incorporated, Dallas, TX (US)

(72) Inventors: Benjamin Stassen Cook, Addison, TX (US); Daniel Lee Revier, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/799,757

(22) Filed: Oct. 31, 2017

(65) Prior Publication Data

US 2019/0131250 A1   May 2, 2019

(51) Int. Cl.
| | |
|---|---|
| *H01L 23/552* | (2006.01) |
| *H01L 21/56* | (2006.01) |
| *H01L 23/29* | (2006.01) |
| *G02B 1/00* | (2006.01) |
| H01L 23/495 | (2006.01) |

(52) U.S. Cl.
CPC .......... *H01L 23/552* (2013.01); *G02B 1/005* (2013.01); *H01L 21/56* (2013.01); *H01L 23/295* (2013.01); *H01L 23/49513* (2013.01); *H01L 23/49541* (2013.01); *H01L 2224/32245* (2013.01); *H01L 2224/48091* (2013.01); *H01L 2224/48247* (2013.01); *H01L 2224/73265* (2013.01); *H01L 2224/97* (2013.01); *H01L 2924/181* (2013.01)

(58) Field of Classification Search
CPC .. H01L 21/56; H01L 23/295; H01L 23/49513
USPC ......................................................... 257/659
See application file for complete search history.

(56) References Cited

U.S. PATENT DOCUMENTS

| | | | |
|---|---|---|---|
| 3,868,759 | A | 3/1975 | Hartleroad et al. |
| 3,868,764 | A | 3/1975 | Hartleroad et al. |
| 4,974,590 | A | 12/1990 | Saito |
| 4,999,587 | A | 3/1991 | Evans |
| 5,355,577 | A | 10/1994 | Cohn |

(Continued)

FOREIGN PATENT DOCUMENTS

| | | |
|---|---|---|
| RU | 1780469 A1 | 10/1995 |
| WO | 2006101577 A2 | 9/2006 |
| WO | 2017111892 | 6/2017 |

OTHER PUBLICATIONS

Optical Sensor-On-Chip ICs Simplify Handheld Spectrometer Design, available at https://www.digikey.com/en/articles/techzone/2017/jun/optical-sensor-on-chip-ics-simplify-handheld-spectrometer-design, Digi-Key Electronics, Jun. 28, 2017, pp. 1-6.

(Continued)

*Primary Examiner* — Tan N Tran
(74) *Attorney, Agent, or Firm* — Michael A. Davis, Jr.; Charles A. Brill; Frank D. Cimino

(57) ABSTRACT

An encapsulated integrated circuit is provided that includes an integrated circuit (IC) die. An encapsulation material encapsulates the IC die. An electromagnetic interference (EMI) shield is provided by a photonic bandgap (PBG) structure that is included within the encapsulation material. The PBG structure is configured to have a photonic bandgap with a frequency range approximately equal to a range of frequencies that may cause EMI.

23 Claims, 13 Drawing Sheets

(56) References Cited

U.S. PATENT DOCUMENTS

| | | | |
|---|---|---|---|
| 5,500,912 | A | 3/1996 | Alonas et al. |
| 5,528,074 | A | 6/1996 | Goto et al. |
| 5,834,320 | A | 11/1998 | Huddleston et al. |
| 6,664,615 | B1 | 12/2003 | Bayan et al. |
| 6,967,347 | B2 | 11/2005 | Estes et al. |
| 6,979,105 | B2 | 12/2005 | Leysath |
| 7,228,016 | B2 | 6/2007 | Beausoleil |
| 7,305,161 | B2 | 12/2007 | Zhou |
| 7,733,198 | B1 | 6/2010 | Olsson et al. |
| 8,031,012 | B2 | 10/2011 | Hasegawa |
| 8,054,145 | B2 | 11/2011 | Mohammadi et al. |
| 8,094,023 | B1 | 1/2012 | El-Kady et al. |
| 8,138,868 | B2 | 3/2012 | Arnold |
| 8,143,637 | B2 | 3/2012 | Kanatake |
| 8,587,182 | B2 | 11/2013 | Reiche |
| 9,018,074 | B2 | 4/2015 | Zhang et al. |
| 9,070,703 | B2 | 6/2015 | Haroun et al. |
| 9,123,737 | B2 | 9/2015 | Haroun et al. |
| 9,306,263 | B2 | 4/2016 | Herbsommer et al. |
| 9,343,426 | B1 | 5/2016 | Parvarandeh |
| 9,373,878 | B2 | 6/2016 | Schuppener et al. |
| 9,450,563 | B2 | 8/2016 | Gorisse et al. |
| 9,583,811 | B2 | 2/2017 | Seler et al. |
| 9,647,329 | B2 | 5/2017 | Herbsommer et al. |
| 9,651,718 | B2 | 5/2017 | Chen et al. |
| 10,062,583 | B2 | 8/2018 | Costa et al. |
| 10,139,564 | B1 | 11/2018 | Homeijer et al. |
| 2005/0224956 | A1 | 10/2005 | Kao et al. |
| 2006/0038168 | A1 | 2/2006 | Estes et al. |
| 2006/0054780 | A1 | 3/2006 | Garrood et al. |
| 2007/0108545 | A1 | 5/2007 | Chua et al. |
| 2008/0112665 | A1 | 5/2008 | Beausoleil et al. |
| 2008/0218299 | A1 | 9/2008 | Arnold |
| 2009/0288852 | A1 | 11/2009 | Hirokawa et al. |
| 2010/0019247 | A1 | 1/2010 | Joichi et al. |
| 2011/0001233 | A1 | 1/2011 | Iwase et al. |
| 2011/0089815 | A1* | 4/2011 | Yeh ................ H01L 33/507 313/501 |
| 2011/0103632 | A1 | 5/2011 | Leclair et al. |
| 2011/0133597 | A1 | 6/2011 | Pavlov et al. |
| 2011/0221057 | A1 | 9/2011 | Lin et al. |
| 2012/0043628 | A1 | 2/2012 | Martin et al. |
| 2012/0098611 | A1 | 4/2012 | Sinha et al. |
| 2012/0154168 | A1 | 6/2012 | Duncan et al. |
| 2013/0038174 | A1 | 2/2013 | Kim et al. |
| 2013/0228796 | A1 | 9/2013 | Mieczkowski |
| 2014/0287703 | A1* | 9/2014 | Herbsommer ......... H01P 3/16 455/90.2 |
| 2015/0237423 | A1 | 8/2015 | Bahr et al. |
| 2015/0295305 | A1 | 10/2015 | Herbsommer et al. |
| 2016/0028367 | A1 | 1/2016 | Shealy |
| 2016/0276311 | A1 | 9/2016 | Meyer et al. |
| 2016/0327977 | A1 | 11/2016 | Tang et al. |
| 2017/0084519 | A1 | 3/2017 | Speight et al. |
| 2017/0108655 | A1 | 4/2017 | Zarbock et al. |
| 2017/0186793 | A1 | 6/2017 | Ockenfuss |
| 2017/0253476 | A1 | 9/2017 | Shibuya et al. |
| 2017/0276870 | A1 | 9/2017 | Snyman |
| 2017/0288123 | A1 | 10/2017 | Hatano et al. |
| 2017/0292884 | A1 | 10/2017 | Ching, Jr. et al. |

OTHER PUBLICATIONS

Hideo Kosaka et al, "Self-Collimating Phenomena in Photonic Crystals", Applied Physics Letters, vol. 74, No. 9, Mar. 1, 1999, pp. 1212-1214.

Benjamin Stassen Cook and Daniel Lee Revier, "Thermal Management in Integrated Circuit Using Phononic Bandgap Structure", U.S. Appl. No. 15/92,580, filed Oct. 24, 2017, pp. 1-33.

Benjamin Stassen Cook and Daniel Lee Revier, "integrated Circuit with Dielectric Waveguide Connector Using Photonic Bandgap Structure", U.S. Appl. No. 15/800,042, filed Oct. 31, 2017, pp. 1-42.

Benjamn Stassen Cook and Daniel Lee Revier, "Galvanic Signal Path Isolation in an Encapsulated Package Using a Photonic Structure", U.S. Appl. No. 15/799,740, filed Oct. 31, 2017, pp. 1-38.

Benjamin Stassen Cook and Daniel Lee Revier, "Spectrometry in Integrated Circuit Using a Photonic Bandgap Structure", U.S. Appl. No. 15/800,009, filed Oct. 31, 2017, pp. 1-41.

Daniel Lee Revier and Benjamin Stassen Cook, "Acoustic Management in Integrated Circuit Using Phononic Bandgap Structure", U.S. Appl. No. 15/792,591, filed Oct. 24, 2017, pp. 1-37.

"Phonon", Wikipedia, available at https://en.wikipedia.org/wiki/Phonon on Aug. 2, 2017, pp. 1-9.

Yan Pennec and Bahram Djafari-Rouhani, "Fundamental Properties of Phononic Crystal", Chapter 2 in "Phononic Crystals", 2016, pp. 23-50.

Daniel Frederic Sievenpiper, "High-Impedance Electromagnetic Surfaces", 1999, University of California, pp. 1-162.

"7 Families of Additive Manufacturing", According to ASTM F2792 Standards, Hybrid Manufacturing Technologies, pp. 1-2.

"Standard Terminology for Additive Manufacturing Technologies", ASTM International, F2792-12a,Sep. 9, 2013, pp. 1-3.

Nagi Elabbasi, "Modeling Phononic Band Gap Materials and Structures", Comsol Blog, Feb. 10, 2016, pp. 1-7.

Dr. Qin Hu, "Multiphoton Lithograpy Based 3D Micro/Nano Printing", EPSRC Centre for Innovative Manufacturing in Additive Manufacturing, pp. 1-30.

International Search Report for PCT/US2018/058478 dated Feb. 14, 2019.

Mohammadi, et al. Complete phononic bandgaps and bandgap maps in two-dimensional silicon phononic crystal plates; Electronics Letters Aug. 2, 2017, vol. 43 No. 16. 2 pages.

International Search Report for PCT/US2018/058481 dated Feb. 7, 2019.

International Search Report for PCT/US2018/058487 dated Feb. 7, 2019.

International Search Report for PCT/US2018/057358 dated Feb. 7, 2019.

International Search Report for PCT/US2018/057351 dated Feb. 7, 2019.

International Search Report for PCT/US2018/049166 dated Dec. 13, 2018.

International Search Report for PCT/US2018/049135 dated Dec. 13, 2018.

International Search Report for PCT/US2018/058494 dated Feb. 21, 2019.

* cited by examiner

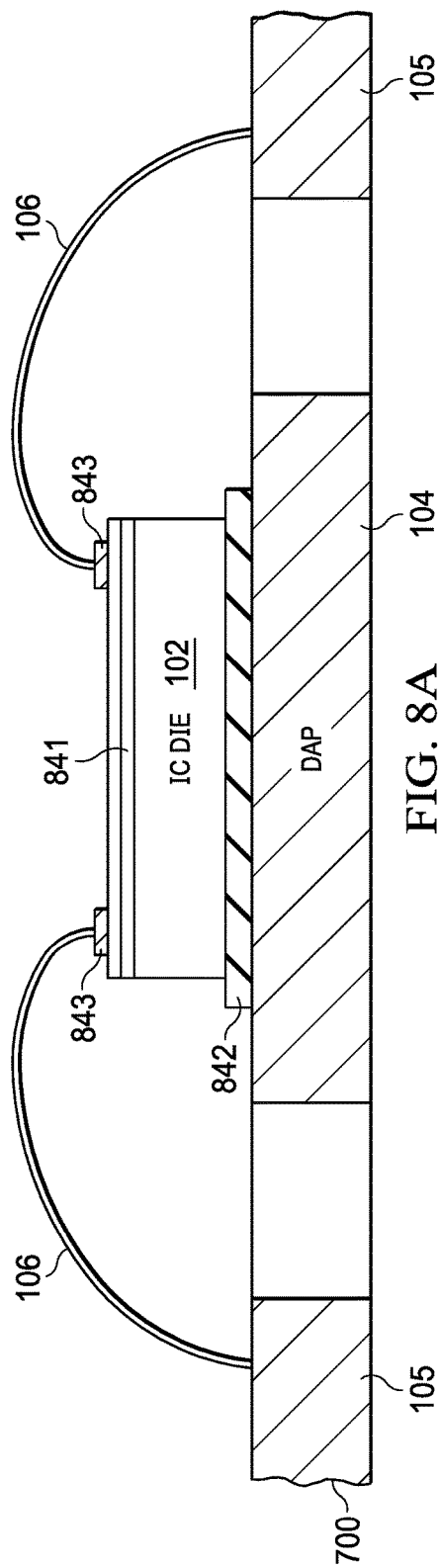
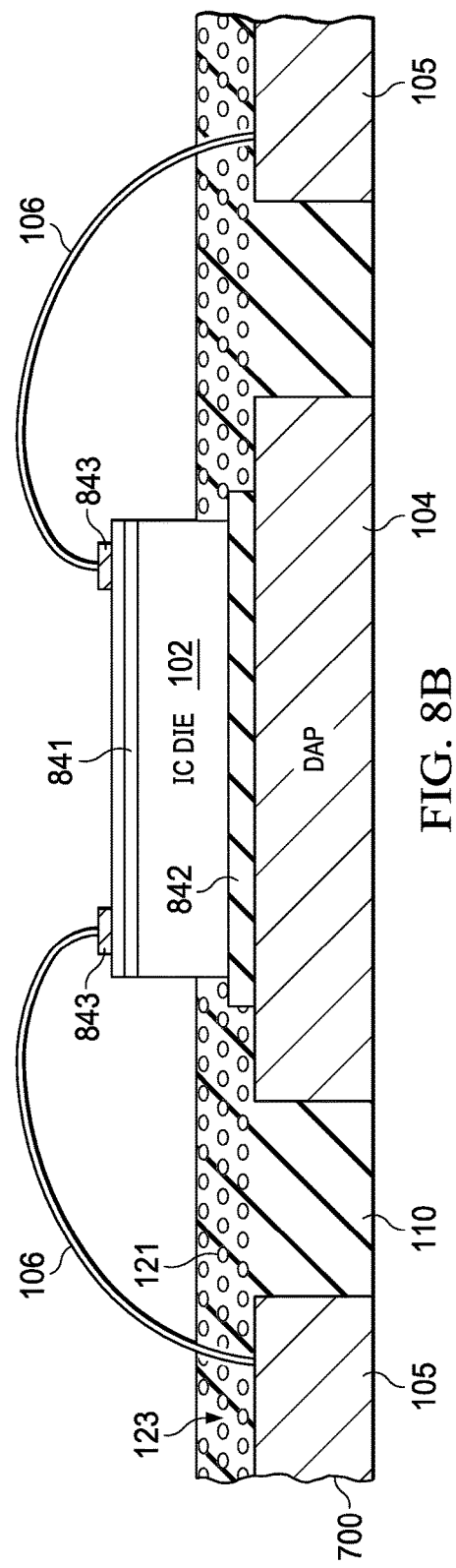
FIG. 8A
FIG. 8B

ELECTROMAGNETIC INTERFERENCE SHIELD WITHIN INTEGRATED CIRCUIT ENCAPSULATION USING PHOTONIC BANDGAP STRUCTURE

FIELD OF THE DISCLOSURE

This disclosure relates to an integrated circuit package that includes a photonic bandgap structure in the package encapsulation material.

BACKGROUND OF THE DISCLOSURE

Individual discrete components are typically fabricated on a silicon wafer before being cut into separate semiconductor die and assembled in a package. The package provides protection against impact and corrosion, holds the contact pins or leads which are used to connect from external circuits to the device, and dissipates heat produced in the device.

Wire bonds may be used to make electrical connections between an integrated circuit and the leads of the package with fine wires connected from the package leads and bonded to conductive pads on the semiconductor die. The leads external to the package may be soldered to a printed circuit board. Modern surface mount devices eliminate the need for drilled holes through circuit boards and have short metal leads or pads on the package that can be secured by reflow soldering.

Many devices are encapsulated with an epoxy plastic that provides adequate protection of the semiconductor devices and mechanical strength to support the leads and handling of the package. Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board.

A dielectric is an electrical insulator that can be polarized by an applied electric field. When a dielectric is placed in an electric field, electric charges do not flow through the material as they do in a conductor, but only slightly shift from their average equilibrium positions causing dielectric polarization. Because of dielectric polarization, positive charges are displaced toward the field and negative charges shift in the opposite direction. This creates an internal electric field which reduces the overall field within the dielectric itself. If a dielectric is composed of weakly bonded molecules, those molecules not only become polarized, but also reorient so that their symmetry axis aligns to the field. While the term "insulator" implies low electrical conduction, "dielectric" is typically used to describe materials with a high polarizability; which is expressed by a number called the relative permittivity ($\varepsilon r$). The term insulator is generally used to indicate electrical obstruction while the term dielectric is used to indicate the energy storing capacity of the material by means of polarization.

Permittivity is a material property that expresses the force between two point charges in the material. Relative permittivity is the factor by which the electric field between the charges is decreased or increased relative to vacuum. Relative permittivity is also commonly known as dielectric constant.

BRIEF DESCRIPTION OF THE DRAWINGS

Particular embodiments in accordance with the disclosure will now be described, by way of example only, and with reference to the accompanying drawings:

FIGS. 8A-8C illustrate formation of a photonic bandgap structure using an additive manufacture process to encapsulate an IC;

Figure 1:
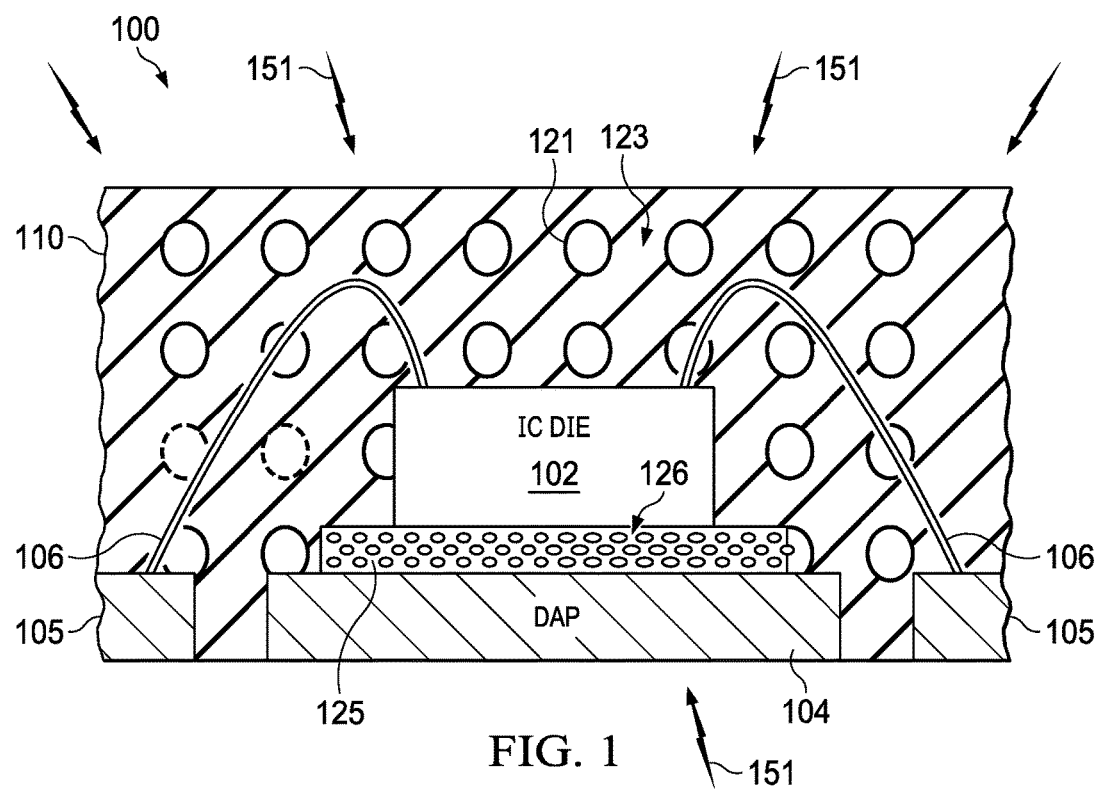
FIG. 1 is an example integrated circuit (IC) package that includes an EMI shield formed by a photonic bandgap structure.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

The epoxy encapsulant for semiconductor chips/packages has typically served the primary purpose of providing environmental and mechanical protection for the integrated circuit (IC). Previously, in order for an additional package function to be added, it must be added before or after the encapsulation step. Performing additional packaging steps may increase cost and limit functionality on the processes that can be performed. A method for encapsulating an IC will now be disclosed in which a structure to perform an additional package function may be created during the process of encapsulation.

As an IC operates, it may be subject to electromagnetic interference (EMI) from source of radiation external to the IC. Traditionally, EMI shielding may be added to an electronics package to block an interfering electromagnetic field using conductive or magnetic materials to surround the sensitive electronic circuits within an IC. EMI shielding may be used to reduce the coupling of radio waves, electromagnetic fields, and electrostatic fields that may be received from external sources. Alternatively, an EMI shield may be provided to prevent electromagnetic energy from radiating from the IC and interfering with adjacent devices. A conductive enclosure used to block electrostatic fields may also be referred to as a "Faraday cage."

In physics, a photon represents an energy packet, or "quanta" of electromagnetic waves. A photon is massless, has no electric charge, and is a stable particle. In the momentum representation of the photon, a photon may be described by its wave vector which determines its wavelength and direction of propagation.

Additive manufacturing has enabled the deposition of patterned materials in a rapid and cost efficient manner. By utilizing additive manufacturing, control structures may be integrated directly into the encapsulation material of an IC. As will be disclosed herein, EMI shielding may be provided in the encapsulation of an IC package through the implementation of multi-material photonic bandgap (PBG) structures within the encapsulation.

Some embodiments may include an antenna structure integrated directly into the encapsulation material along with an EMI shield. Integrating the PBG structures directly into the encapsulation material provides an improved new packaging technique that may be used to minimize electromagnetic interference and to protect from electrostatic discharge.

FIG. 1 is an example integrated circuit (IC) package 100 that includes an EMI shield formed by a photonic bandgap structure within the encapsulant material 110. IC die 102 may be attached to a die attach pad (DAP) 104 of a leadframe that includes a set of contacts 105. DAP 104 may also be referred to as a "thermal pad." IC die 100 may also be referred to as a "chip." IC die 102 may be fabricated using known or later developed semiconductor processing techniques. IC die 102 may include an epitaxial (epi) layer on the top surface in which are formed various semiconductor transistor devices and interconnects. One or more conductive layers may be formed on the epi layer and patterned into interconnect traces and bond pads. A set of bond wires 106 may be attached to contacts 105 and bond pads located on the surface of IC die 106 using known or later developed wire bonding techniques. In this example, IC package 100 is a quad-flat no-leads (QFN) package; however, in other embodiments various known or later developed packaging configurations, such as DFN, MLF, SON, dual inline packages (DIP), etc, may be fabricated using the techniques disclosed herein to form an encapsulated package with a photonic bandgap structure included within the encapsulant material.

In this example, a solid encapsulant material 110 surrounds and encapsulates IC die 102. A portion of the encapsulation material may include a matrix of interstitial nodes such as indicated at 121 that may be filled with a material that is different from encapsulation material 110. In this example, nodes 121 are arranged in a three dimensional array of spherical spaces that are in turn separated by a lattice of encapsulation material 123. Encapsulation material 123 may be the same or different as solid encapsulation material 110. The structure formed by the matrix of nodes 121 and lattice 123 will be referred to herein as a "photonic bandgap structure." The photonic bandgap (PBG) structure formed by periodic nodes 121 may effectively block EMI radiation 151 received from an external source from reaching circuitry located on IC die 102. Similarly, an EMI shield formed by nodes 121 may effectively block electromagnetic energy from being radiated by circuitry on IC die 102 and thereby preventing EMI to adjacent devices.

Solid encapsulant material 110 is typically an epoxy based material that provides mechanical protection and seals IC die 102 from environmental gases and liquids.

In this example, lattice 123 may be in contact at various places across the entire upper surface of IC die 102. As mentioned above, lattice 123 may be formed from the same material as solid encapsulation material 110, or it may be formed using a different material by using an additive manufacturing process. The array of nodes 121 may be formed with one or more different materials. For example, some of the nodes, such as nodes 121, may be filled with a first material and some of the nodes 121 may be filled with different types of material. There may be a number (N) of different materials that are used to fill N different sets of nodes within encapsulation material 123. Node material may be a polymer or other material that has different intrinsic material properties from the lattice material 123. For example, the node material may have various different intrinsic material properties from the lattice material, such as permittivity, permeability, conductivity, etc.

For example, certain nodes 121 may be filled with a high dielectric material, while other nodes 121 are filled with a low dielectric material. In some embodiments, node material 121 may be air, some other gas, or even a vacuum.

In the example of FIG. 1, lattice 123 forms a square three dimensional (3D) array of spherical nodes. In other embodiments, a differently shaped lattice may be formed to produce other shapes of arrays and nodes 121, such as: triangular, rectilinear, hexagonal, round nodes, elongated nodes, tubes, etc.

In some embodiments, die attachment 125 may be a thin layer of adhesive material. In other embodiments, die attachment 125 may include a portion 126 that is a photonic bandgap structure. As will be explained in more detail below, this may allow shielding a portion of the IC die 102 from EMI 151 that is transferred to die attach pad 104 from a substrate to which IC 100 is attached.

A photonic crystal is an artificially manufactured structure, or material, with periodic constitutive or geometric properties that are designed to influence the characteristics of electromagnetic wave propagation. When engineering these crystals, it is possible to isolate these waves within a certain frequency range. Conversely it may be more helpful to consider these waves as particles and rely on the wave-particle duality throughout the explanation. For this reason, reference to "propagation" herein may refer to either the wave or particle movement through the substrate. Propagation within this selected frequency range, referred to as the band gap, is attenuated by a mechanism of interferences within the periodic system. Such behavior is similar to that of a more widely known nanostructure that is used in semiconductor applications, a photonic crystal. The general properties and characteristics of phononic and photonic structures are known, for example, see: "Fundamental Properties of Phononic Crystal", Yan Pennec and Bahram Djarari-Rouhani, Chapter 2 of "Phononic Crystals, Fundamentals and Applications" 2015, which is incorporated by reference herein.

Photonic crystals are formed by a periodic repetition of inclusions in a matrix. The dielectric properties, shape, and arrangement of the scatterers may strongly modify the propagation of the electromagnetic waves in the structure. The photonic band structure and dispersion curves can then be tailored with appropriate choices of materials, crystal lattices, and topology of inclusions.

Similarly to any periodic structure, the propagation of electromagnetic waves in a photonic crystal is governed by the Bloch or Floquet theorem from which one can derive the band structure in the corresponding Brillouin zone. The periodicity of the structures, that defines the Brillouin zone, may be in one (1D), two (2D), or three dimensions (3D).

The general mechanism for the opening of a band gap is based on the destructive interference of the scattered waves by the inclusions. This necessitates a high contrast between the properties of the materials. In periodic structures, this is called the Bragg mechanism and the first band gap generally occurs at a frequency which is about a fraction of c/a, where "c" is a typical velocity of light, and "a" is the period of the structure.

Photonic bandgap structures may be designed and modeled using simulation software available from various vendors. For example, physics-based systems may be modeled and simulated using COMSOL Multiphysics® simulation software from COMSOL®. "Multiphysics" and "COMSOL" are registered trademarks of COMSOL AB. HFSS (High Frequency Structure Simulator) is available from Ansys. CST (Computer Simulation Technology) offers several simulation packages.

Figure 2A:
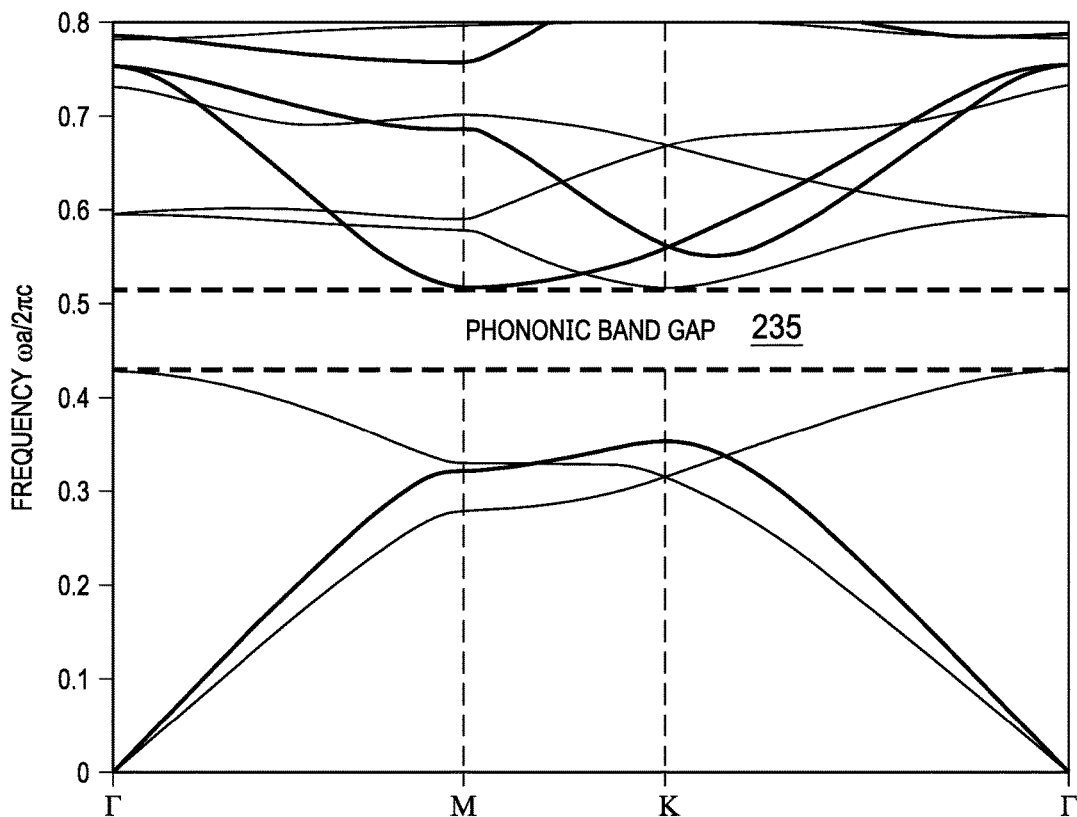
FIGS. 2A-2C is a frequency dispersion plot illustrating a band gap in a photonic bandgap structure having a hexagonal lattice.
Figure 2B:
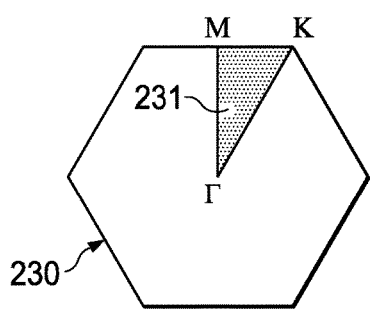
Figure 2C:
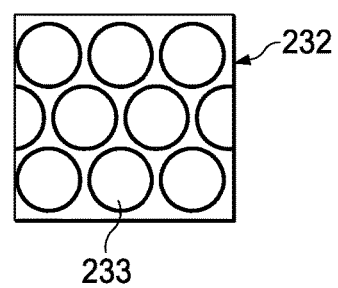
Figure 3:
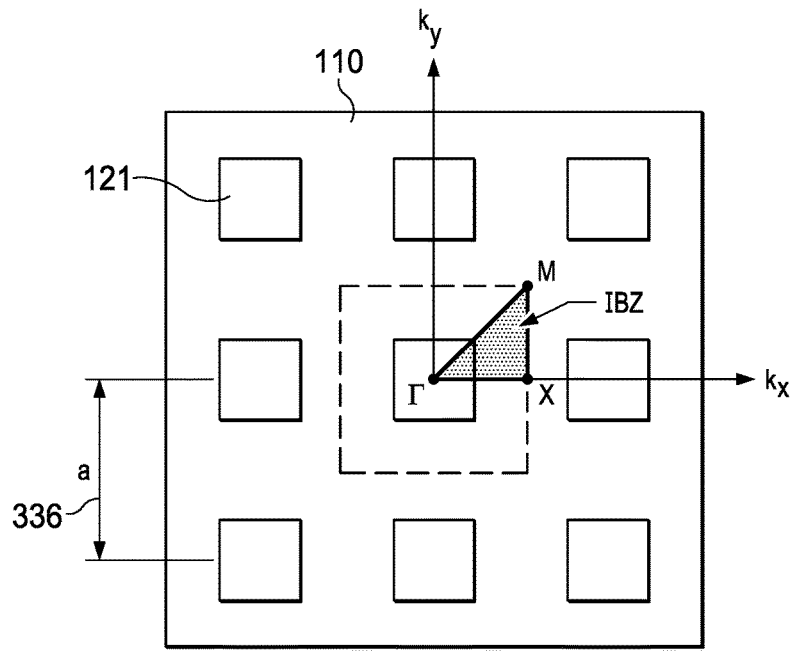
FIG. 3 is an example of another photonic bandgap structure having a square lattice.

FIG. 2A is a frequency dispersion plot illustrating a band gap in a photonic bandgap structure having a hexagonal lattice. FIG. 2B illustrates a single cell 230 of the hexagonal matrix and illustrates Brillouin zone 231 for the hexagonal cell. FIG. 2C illustrates a larger portion of a hexagonal photonic crystal 232 formed by a 3D matrix of nodes as indicated at 233. FIG. 3 is an example of another photonic bandgap structure having a square lattice.

The x-axis of FIG. 2A represents the periphery of Brillouin zone 231 of photonic crystal 232 as defined by points r, M, and K. The y-axis represents the angular frequency of acoustic energy propagating in photonic crystal 232 in units of $\omega a/2\pi C$. The various plot lines represent propagation paths through Brillouin zone 231. Region 235 represents a photonic band gap in which the propagation of waves falling within the defined band of frequencies is blocked by interference produced by the crystal lattice.

The width and the frequency range covered by a photonic bandgap depends on the periodic spacing of the nodes 233, which may be represented by lattice constant "a" as indicated at 336 in FIG. 3, and the relative difference between the dielectric constant of the lattice material and the dielectric constant of the nodes. For example, the frequency range covered by photonic bandgap 235 may be shifted to a higher frequency range for larger relative differences between the dielectric constant of the lattice and the dielectric constant of the nodes, while the photonic bandgap 235 may be shifted to a lower frequency range for smaller relative differences between the dielectric constant of the lattice and the dielectric constant of the nodes.

Figure 4:
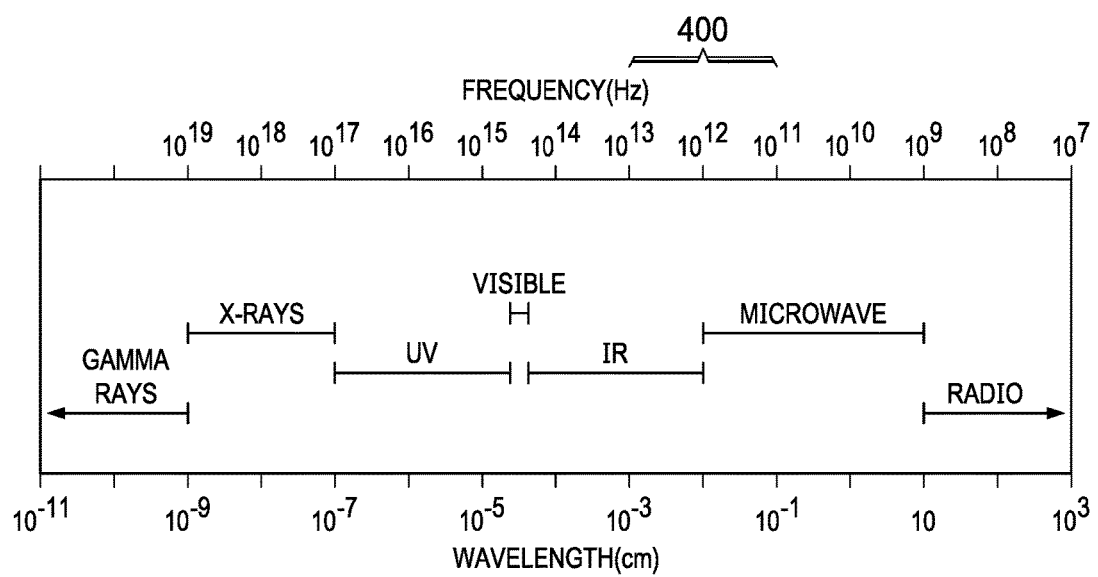
FIG. 4 is a plot illustrating a portion of the electromagnetic frequency spectrum vs. wavelength.

FIG. 4 is a plot illustrating a portion of the electromagnetic frequency spectrum vs. wavelength for an example dielectric solid material. The velocity (v) of an electromagnetic wave in a vacuum is approximately equal to the speed of light (c) in a vacuum, which is approximately $3 \times 10^8$ m/s. The velocity of an electromagnetic wave through a solid material is defined by expression (1), where $\varepsilon_r$ is the relative permittivity of the solid material, which may also be referred to as the "dielectric constant" of the material $$v = c/\sqrt{\varepsilon r} \tag{1}$$

The photonic wavelength (λ) may be determined using expression (2), where the velocity (v) in dielectric materials is typically on the order of $1\text{-}2.5 \times 10^8$ m/s for dielectric constant values in the range of approximately 1-10, and f is the frequency of the photon.

$$\text{lambda}(\lambda) = v/f \tag{2}$$

For electromagnetic signals in the GHz to low THz frequency range, for example, the corresponding wavelengths in encapsulant material 120 may be in the range of several microns to several hundred microns, as indicated at 400. The opening of wide photonic band gaps requires two main conditions. The first one is to have a large physical contrast, such as density and speed of propagation of the wave movements, between the nodes and the lattice. The second condition is to present a sufficient filling factor of the nodes in the lattice unit cell. The forbidden band gap occurs in a frequency domain given by the ratio of an effective propagation velocity in the composite material to the value of the lattice parameter of the periodic array of nodes. Referring to FIG. 3, as a rule of thumb the lattice dimension 336 may be selected to be about one half of the wavelength of the center of the target photonic bandgap.

While the effect of dielectric constant (εr) is described above, other intrinsic properties of a material may be evaluated during the design of a PBG structure, such as permeability, conductivity, etc.

Figure 5:
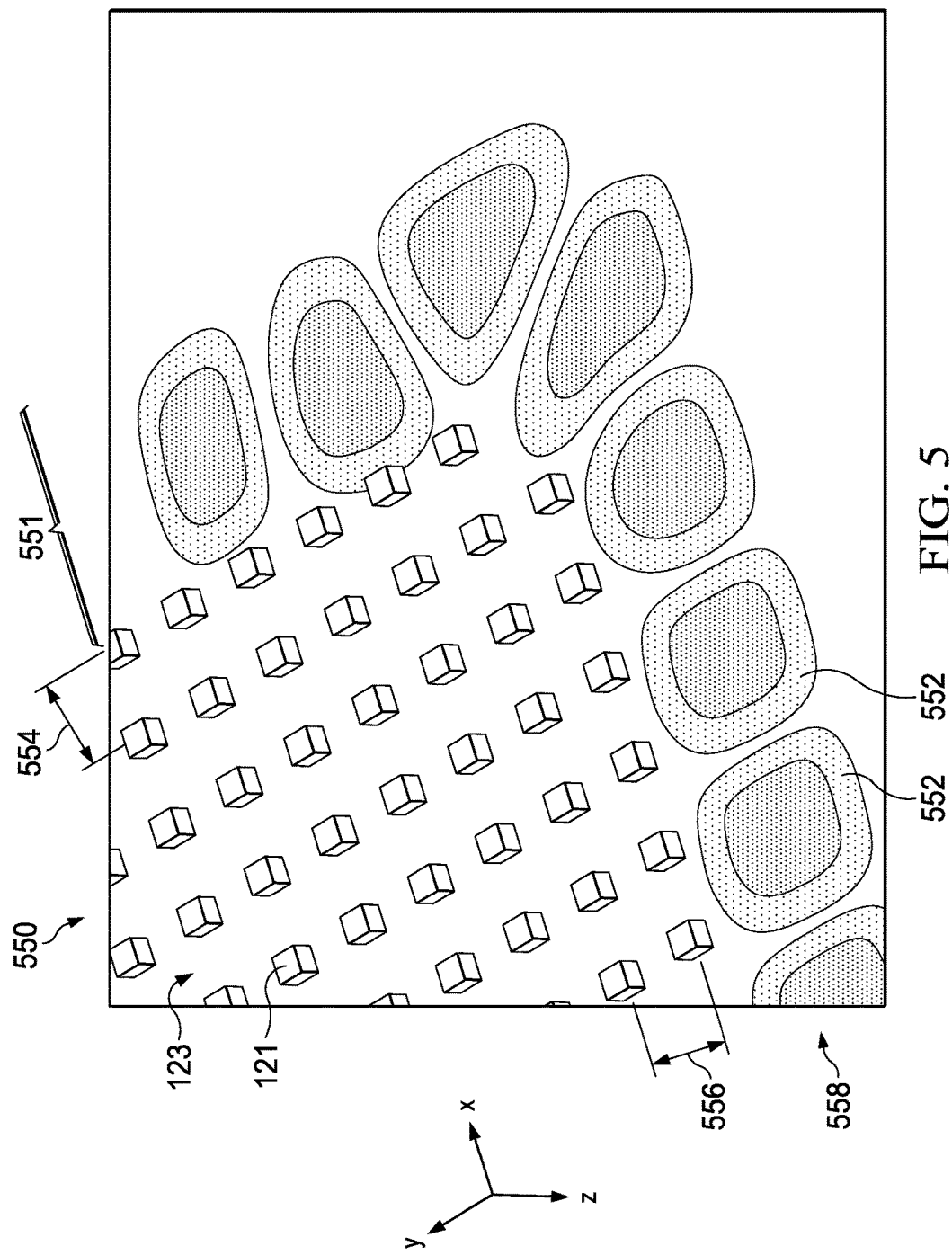
FIG. 5 illustrates another example EMI shield formed by a photonic bandgap structure.

FIG. 5 illustrates an example EMI shield 550 formed by an example photonic bandgap structure 550. This example illustrates a region 551 along an edge of EMI shield 550 that may be formed in IC 100, referring back to FIG. 1. As described above, a photonic bandgap structure may be formed within encapsulation material 123 by inserting a matrix of nodes 121 with a periodic spacing. In this example, the x-axis node spacing 554 is approximately equal to the y-axis node spacing 556. The z-axis node spacing (not shown) is also approximately the same as node spacing 554, 556 in this example.

The node spacing 554-556 in this example may be selected to be approximately one half the wavelength of a selected frequency of EMI radiation represented by photons 552 that should be blocked by bandgap structure 550. In this manner, electromagnetic energy in the form of photons 552 that falls within the bandgap frequency range of EMI shield 550 that enter region 551 may blocked from penetrating into EMI shield 550.

Figure 6:
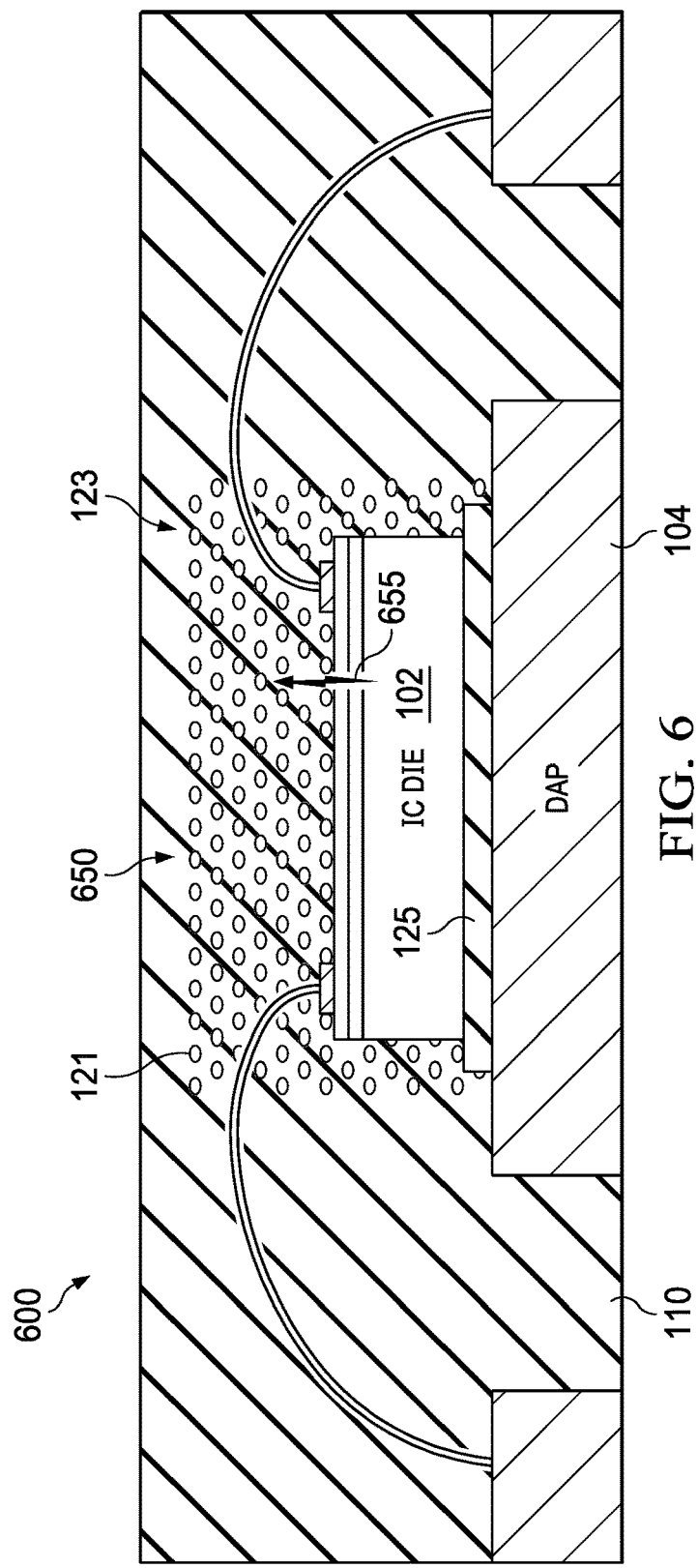
FIG. 6 is a cross section of an example encapsulated IC that includes an EMI shield formed by a photonic bandgap structure.

FIG. 6 is a cross sectional view of IC 600 that includes an example EMI shield structure 650 that is configured to block EMI 655 produced by circuitry on IC die 102 from escaping from encapsulated package 600. In this example, PBG structure 650 may be implemented in only a limited portion of encapsulation material 110, but still provide effective EMI protection for circuitry located on IC die 102.

Similarly, EMI structure 650 may provide EMI protection to circuitry located on IC die 102 from external sources of EMI.

Figure 7:
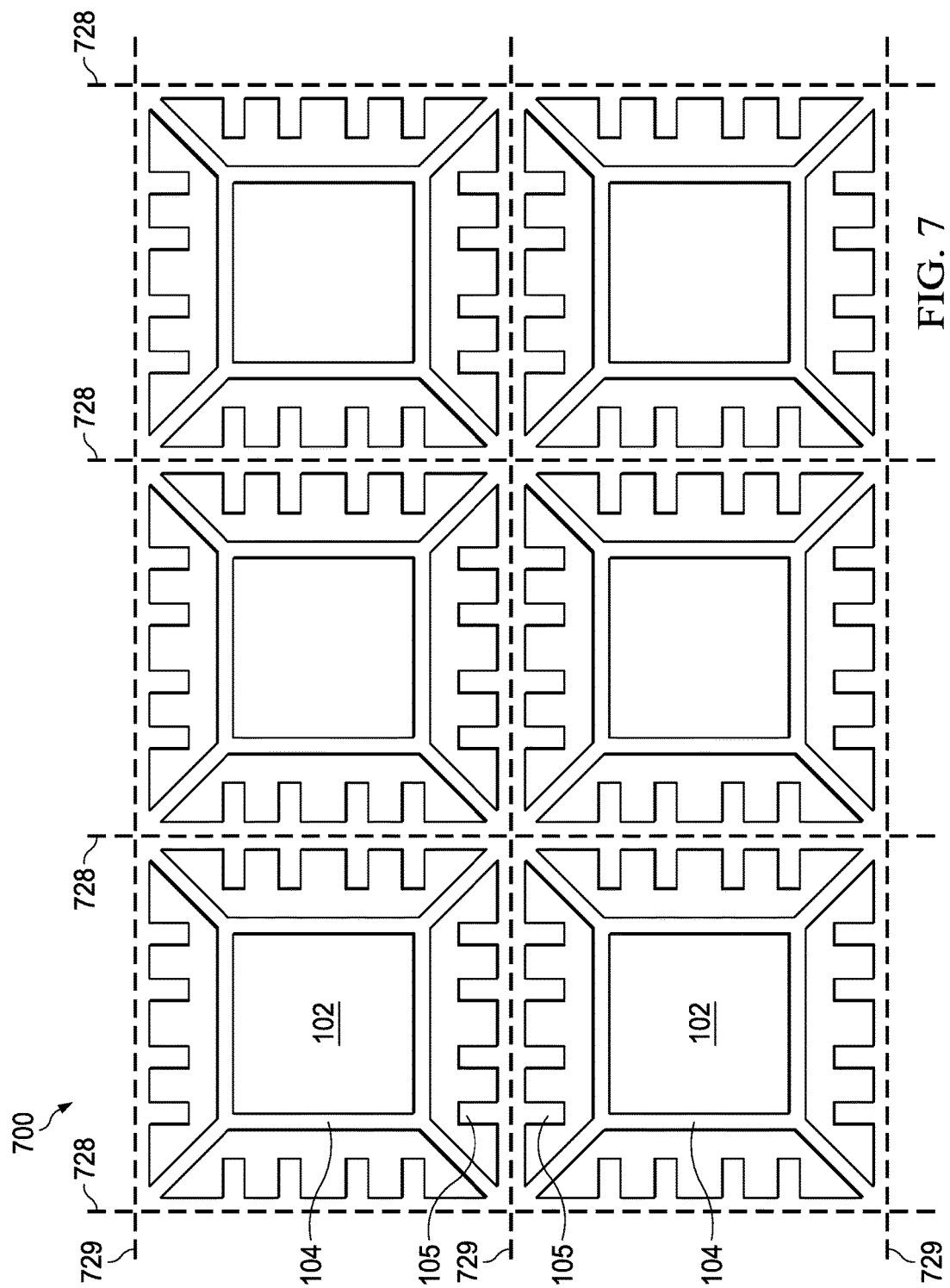
FIG. 7 is a top view of an example leadframe.

FIG. 7 is a top view of an example QFN leadframe 700 that may be used to support IC 100 in FIG. 1, for example. Other types of packages may use a leadframe strip that has a different known or later developed configuration. Lead frame strip 700 may include one or more arrays of individual lead frames. Lead frame strip 700 is typically fabricated from a copper sheet that is etched or stamped to form a pattern of thermal pads and contacts. Lead frame strip 700 may be plated with tin or another metal that will prevent oxidation of the copper and provide a lower contact surface that is easy to solder. An IC die may be attached to each individual lead frame.

Each individual leadframe may include a die attach pad, such as die attach pads 104. Each individual lead frame also includes a set of contacts that surround the die attach pad, such as contacts 105. A sacrificial strip of metal connects all of the contacts together and provides mechanical support until a sawing process removes it. An IC die, also referred to as a "chip," is attached to each die attach pad during a packaging process. Wire bonding may then be performed to connect bond pads on each IC chip to respective contacts on the lead frame. The entire lead frame strip 700 may then be covered with a layer of mold compound using an additive process as described in more detail below to encapsulate the ICs. Lead frame strip 700 may then be singulated into individual packaged ICs by cutting along cut lines 728, 729.

Figure 8C:
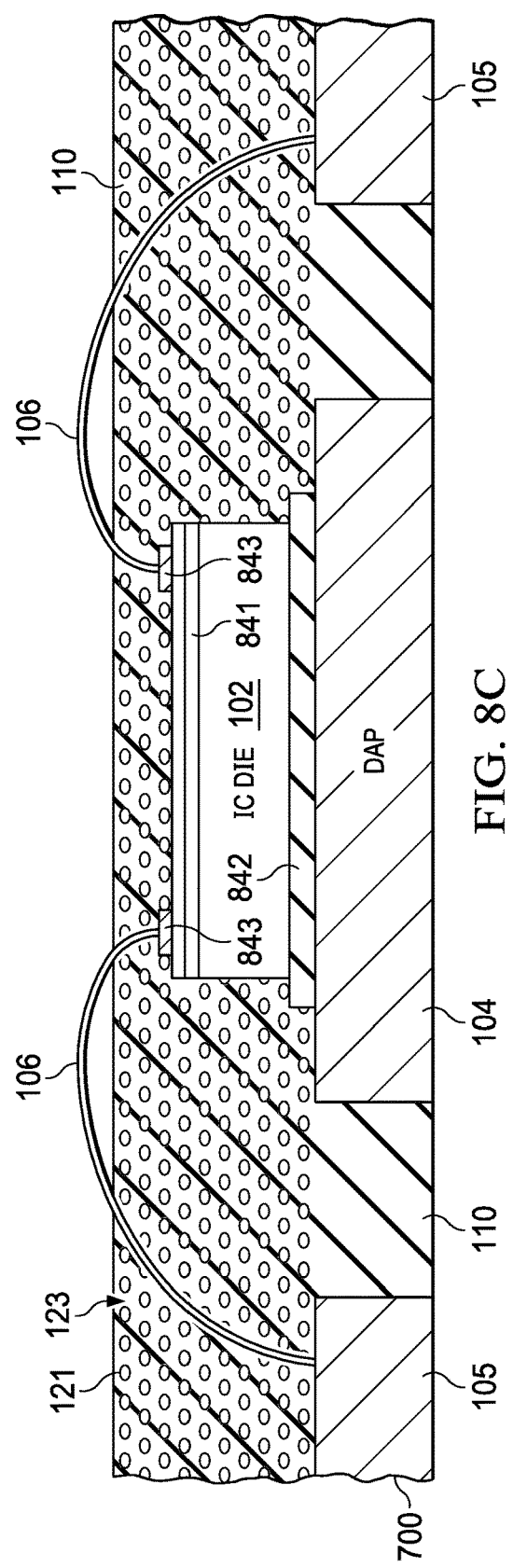

FIGS. 8A-8C are cross sectional views illustrating fabrication of the example IC package 100 of FIG. 1. IC die 102 may be attached by die attach layer 842 to a die attach pad 104 of a leadframe that may be part of a leadframe strip similar to leadframe strip 700 shown in FIG. 7 that includes a set of contacts 105. IC die 102 may be fabricated using known or later developed semiconductor processing techniques. IC die 102 may include an epitaxial (epi) layer 841 on the top surface in which are formed various semiconductor transistor devices and interconnects. One or more conductive layers may be formed on the epi layer and patterned into interconnect traces and bond pads 843. A set of bond wires 106 may be attached to contacts 105 and bond pads 843 located on the surface of IC die 102 using known or later developed electrical connection techniques. In this example, IC package 100 is a quad-flat no-leads (QFN) package; however, in other embodiments various known or later developed packaging configurations, such as DFN, MLF, SON, dual inline packages (DIP), etc, may be fabricated using the techniques disclosed herein to form an encapsulated package with a EMI shielding photonic bandgap structure included with the encapsulant material.

FIG. 8B is a cross sectional view illustrating partial formation of encapsulation material 110. Additive manufacturing processes are now being used in a number of areas. The International Association for Testing Materials (ASTM) has now promulgated ASTM F7292-12a "Standard Terminology for Additive Manufacturing Technologies" 2012 which is incorporated by reference herein. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility. Recent process advances allow additive manufacturing of 3D structures that have feature resolution of less than 100 nm, such as direct laser lithography, multi-photon lithograph, two-photon polymerization, etc.

In this example, a vat photopolymerization process may be used in which leadframe strip and the ICs attached to it, such as IC die 102, are lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. For example, encapsulant material that forms lattice 123 may be the same or different as the solid encapsulant material 110. Nodes 121 may be formed with any selected lattice spacing.

FIG. 8C is a cross sectional view illustrating further partial formation of encapsulation material 110 around IC die 102. Additional layers of liquid encapsulation material 110 have been exposed and converted to a solid. Selective exposure of the liquid resin allows lattice 123 to be formed with nodes 121, as described with regard to FIG. 1.

The leadframe strip may be submerged in different vats at different times in order to allow different materials to form the nodes 121 within lattice 123.

Additional layers of resin may be exposed and hardened to form the final outside encapsulation layer illustrated in FIG. 1. The leadframe strip may then be sawed or otherwise separated into individual encapsulated IC packages.

In another embodiment, other additive manufacturing processes may be used to form encapsulation material 110. For example, a powdered bed diffusion process may be used in which a powdered material is selectively consolidated by melting it together using a heat source such as a laser or electron beam.

In another embodiment, a material jetting process may be used in which droplets of material are deposited layer by layer to produce an EMI shield within an encapsulation structure as described herein. However, bond wires 106 may require extra care to avoid disrupting the droplet streams.

In another embodiment, bond wires are not initially bonded to contacts 105 and bond pads 843. In this example, a material jetting process may be used in which droplets of material are deposited layer by layer to produce a photonic bandgap structure as described herein. As part of the material jetting process, a conductive material may be deposited to form the bond wires between contacts 105 and bond pads 843. In some embodiments, a sintering process may be done by heating the encapsulated leadframe 700 assembly to further solidify the bond wires. The leadframe strip 700 may then be sawed or otherwise separated into individual encapsulated IC packages.

In another embodiment, IC die 102 is not initially attached to die attach pad 104 of a leadframe that may be part of a leadframe strip similar to leadframe strip 700 shown in FIG. 7. In this example, a vat photopolymerization process may be used in which the leadframe strip is lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 110 may be formed in selected shapes. In this manner, a photonic bandgap structure 126 as shown in FIG. 1 may be fabricated on top of die attach pad 104 to isolate a later attached IC die from die attach pad 104. Spaces may be left above each contact 105 for later attachment of bond wires. A set of bond wires 106 may be attached to contacts 105 and bond pads 643 located on the surface of IC die 106 using known or later developed wire bonding techniques. Additional layers of resin may be exposed and hardened to form an additional photonic bandgap structure as described with regard to FIGS. 8A-8C, for example. The leadframe strip may then be sawed or otherwise separated into individual encapsulated IC packages.

In another embodiment, the photonic bandgap structure may be fabricated using a lattice material that includes filler particles diffused throughout the lattice material in place of the explicitly formed nodes as described above, such as nodes 121. In this case, the filler particles are selected to have a size and material composition that will influence the characteristics of electromagnetic wave propagation, as described above. The filler material may be a polymer or other material that has different intrinsic material properties from the lattice material, in a similar manner as the difference between nodes 121 and lattice material 123. In some embodiments, the filler material may have a higher dielectric constant than the lattice material, while in other embodiments the filler material may have a lower dielectric constant than the lattice material.

In another embodiment, multiple photonic bandgaps may be formed by using two or more types of fillers. For example, a portion of the filler material may have a high dielectric constant, while another portion of the filler material may have a low dielectric constant. In some embodiments, different size filler particle may be used in different regions or in a same region to form multiple bandgaps. In some embodiments, a different number of filler particles per unit volume may be used in different regions to form different bandgaps.

In this case, the filler dispersion may not be perfectly crystalline, but there will be a statistical mean separation of the filler particle that may lend itself to a bandgap based on the statistical mean separation distance of the filler particles.

An additive manufacturing process may be used to encapsulate an IC die using two or more different polymers, such as one with filler particles and one without filler particles to form the PBG structures as described herein or other configurations of PBG structures.

Alternatively, a selective molding process may be used in which one area of the encapsulation is molded with first polymer having either no filler particles or a first configuration of filler particles (size, material, number of particles per unit volume, etc.) and other areas are molded with a polymer having a different filler particle configuration to form a PBG structure as described herein or other configurations of PBG structures.

Figure 9A:
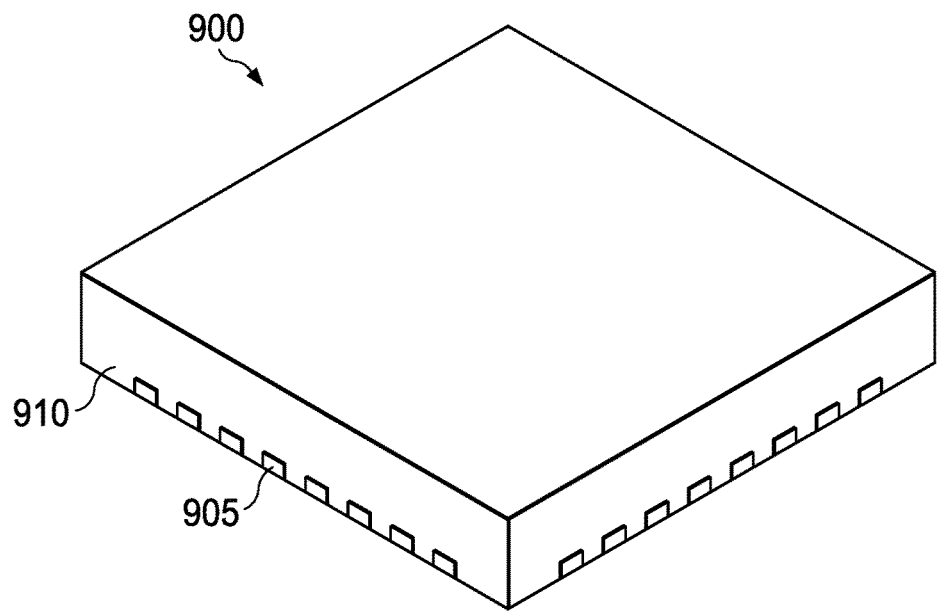
FIGS. 9A-9B illustrate a top and bottom view of an example IC package containing a photonic bandgap structure.
Figure 9B:
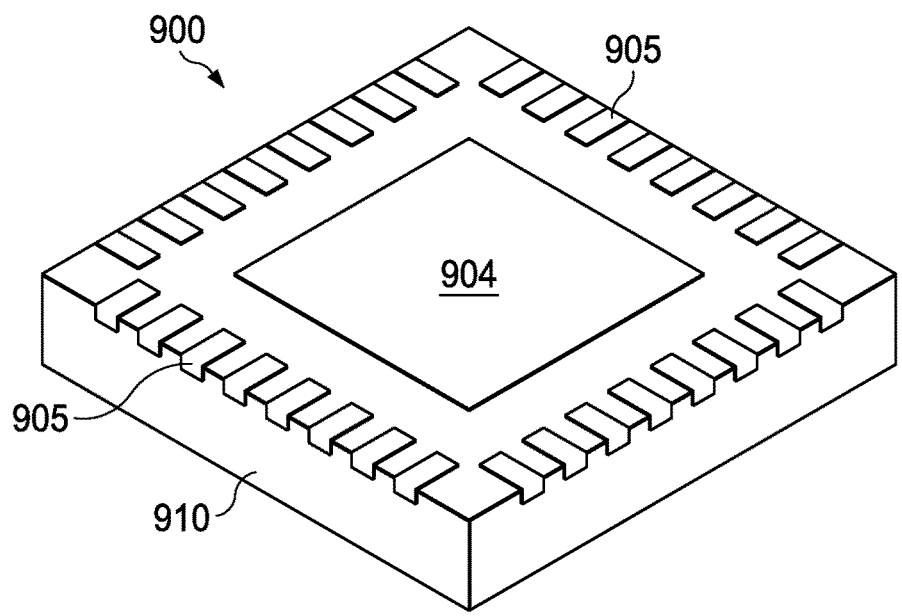

FIGS. 9A-9B are top and bottom views of an example IC package 900 that includes an EMI shield provided by a photonic bandgap structure within the encapsulant material as described herein. IC 900 is an illustration of a quad-flat no-leads (QFN) IC package that was encapsulated using additive manufacturing process to form EMI shielding structures within the encapsulation material as described herein. FIG. 9A illustrates a top side and FIG. 9B illustrates a bottom side of QFN package 900. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale plastic encapsulation package made with a planar copper lead frame substrate. Perimeter lands on the package bottom provide electrical connections to the PCB. Flat no-lead packages include an exposed thermal pad 904 to improve heat transfer out of the IC (into the PCB). Heat transfer can be further facilitated by metal vias in the thermal pad. The QFN package is similar to the quad-flat package, and a ball grid array.

QFN package 900 includes a set of contacts 905 arrayed around the perimeter of the package on the bottom side. Thermal pad 904 has an exposed surface on the bottom side of QFN 900. An integrated circuit die (not shown) is mounted to the other side of thermal pad 904. The entire assembly is encapsulated in an encapsulation material 910 using a manufacturing process as described herein to form an EMI shielding photonic bandgap structure. While a QFN is illustrated in FIGS. 9A-10B, other embodiments may use other types of integrated circuit packages.

Figure 10:
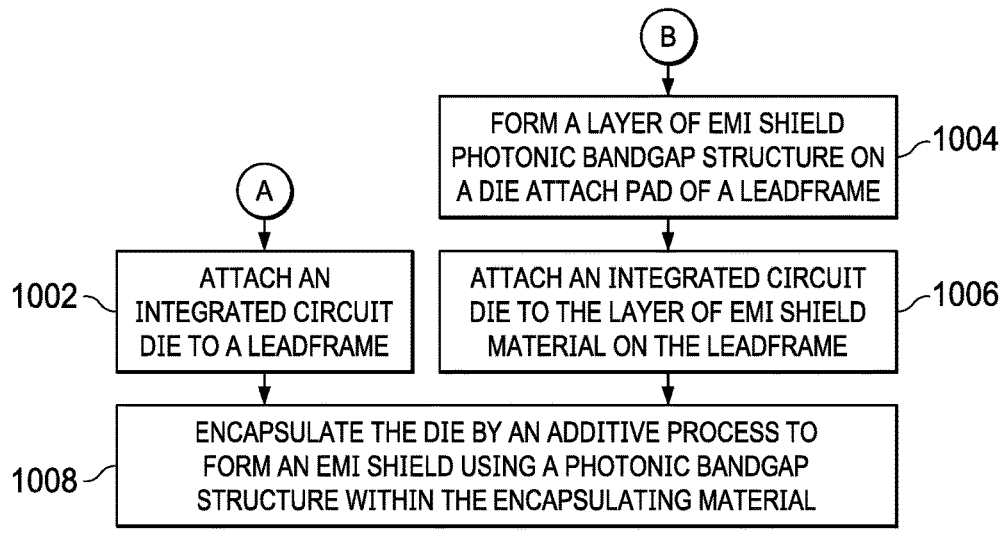
FIG. 10 is a flow chart illustrating an example process for formation of an EMI shield from an photonic bandgap structure within an IC package.

FIG. 10 is a flow diagram illustrating fabrication of the example IC of FIG. 1. In one embodiment, as described above in more detail, an IC die may be attached to a die attach pad of a leadframe that includes a set of contacts as indicated at box 1002. The IC die may be fabricated using known or later developed semiconductor processing techniques. The IC die may include an epitaxial (epi) layer on the top surface in which are formed various semiconductor transistor devices and interconnects. One or more conductive layers may be formed on the epi layer and patterned into interconnect traces and bond pads. A set of bond wires may be attached to the contacts and bond pads located on the surface of the IC die using known or later developed wire bonding techniques.

In another embodiment, a layer of EMI shielding material that includes a photonic bandgap structure may be first formed on the die attach pad of the leadframe, as indicated at 1004. The encapsulation material may be formed into a lattice with periodically spaced nodes that are filled with a different type of material to form a photonic bandgap structure. As described above in more detail, an additive manufacturing process may be used to create the lattice and fill the nodes in the lattice.

An IC die may then be attached to the layer of EMI shielding encapsulation material, as indicated at 1006.

The IC die may then be completely encapsulated by an additive process to form an EMI shielding PBG structure within the encapsulation material as indicated at 1008. A first portion of the encapsulation material may be solid and a second portion of the encapsulation material may include nodes filled with a second material to form a photonic bandgap structure. As described above in more detail, an additive manufacturing process may be used to create a lattice and fill the periodically spaced nodes in the lattice with a different type of material, or with several different types of material in different locations.

In another embodiment, the encapsulation process indicated at box 1008 may be done using a selective molding process in which one area of the encapsulation is molded with first polymer having either no filler particles or a first configuration of filler particles (size, material, number of particles per unit volume, etc.) and other areas are molded with a polymer having a different filler particle configuration diffused within the polymer to form a PBG structure as described herein or other configurations of PBG structures.

As discussed above in more detail, various types of IC packages may be formed in this manner. For example, a quad-flat no-leads (QFN) package is illustrated in FIG. 1. However, in other embodiments various known or later developed packaging configurations, such as DFN, MLF, SON, flip-chips, dual inline packages (DIP), etc, may be fabricated using the techniques disclosed herein to form an encapsulated package with an EMI shield included with the encapsulant material.

Figure 11:
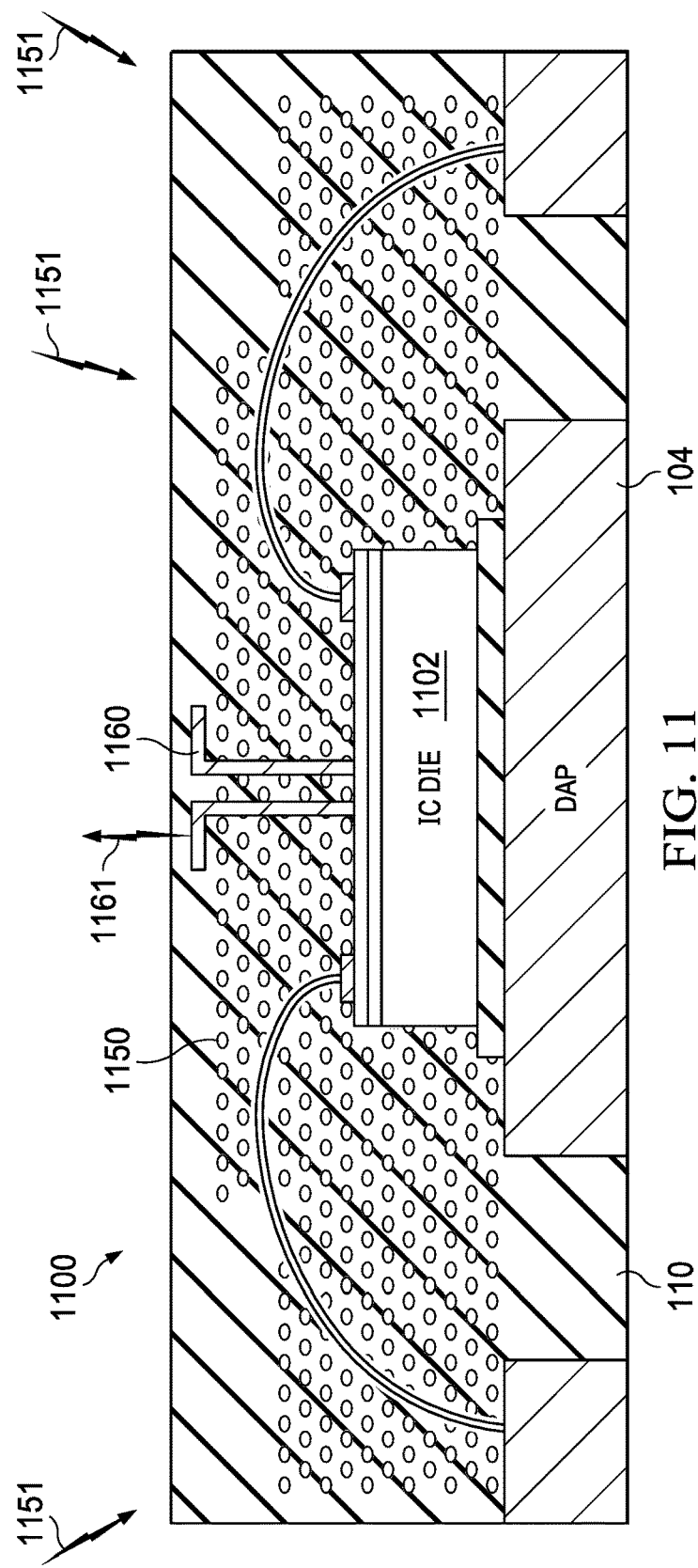

FIG. 11 is a cross sectional view of an encapsulated IC 1100 that may include an antenna 1160 within the encapsulation material. In this example, PBG structure 1150 may provide EMI shielding from stray EMI signals 1151, as described above in more detail.

Antenna 1160 may be formed within encapsulation material 110 using a conductive material to form a known or later developed antenna configuration configured to radiate and/or receive radio frequency (RF) signals 1161 that may be generated/received by RF circuitry that is located on IC die 1102.

Figure 12:
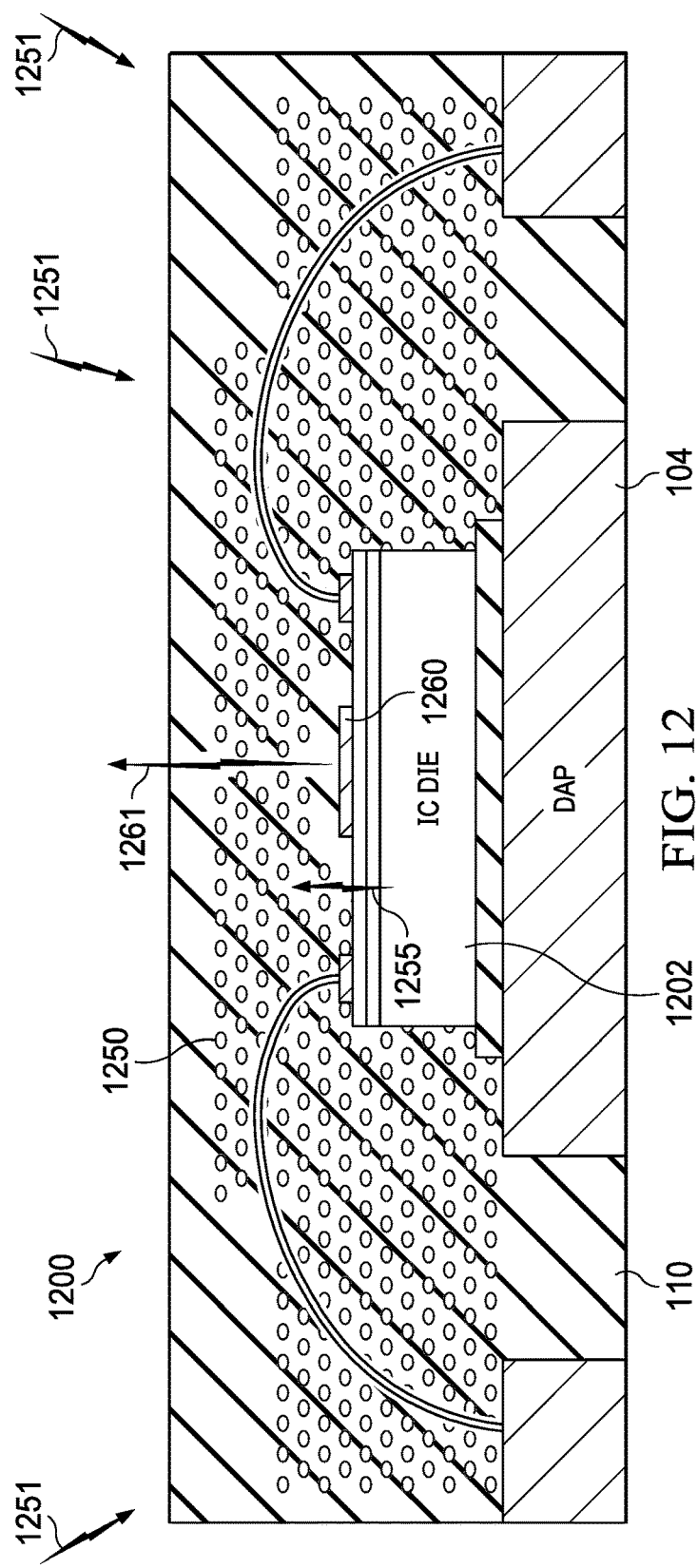

FIG. 12 is a cross sectional view of an encapsulated IC 1200 that may include an antenna 1260 within the encapsulation material. In this example, PBG structure 1250 may provide EMI shielding from stray EMI signals 1251, as described above in more detail. Alternatively, EMI shield 1250 may serve to block radiation of signals 1255 produced by circuitry on IC die 1202 that may act as EMI on other devices, for example.

Antenna 1260 may be formed within a conductive layer on the top surface of IC die 1202 to form a known or later developed antenna configuration configured to radiate and/or receive radio frequency (RF) signals 1261 that may be generated/received by RF circuitry that is located on IC die 1202. In this example, the frequency of RF signals 1261 may be outside the bandgap range provided by PBG structure 1250 and therefore are able to propagate through PBG structure 1250 with no or little signal loss.

Figure 13:
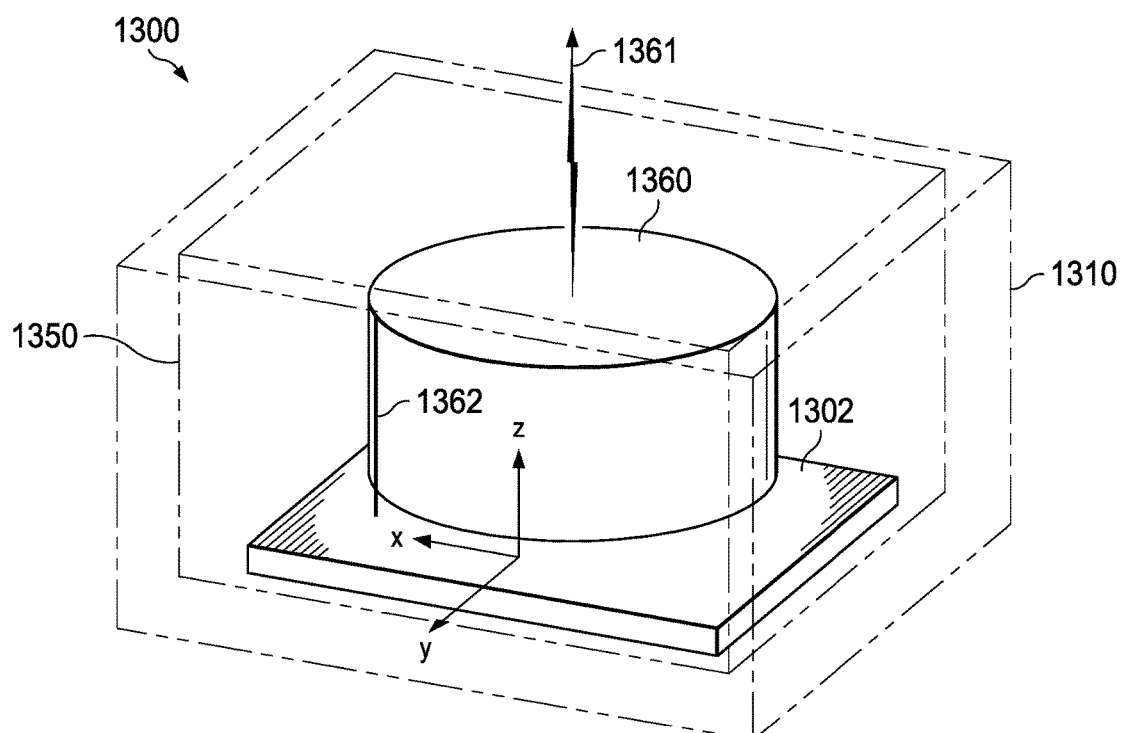
FIGS. 11-13 are cross sectional views of various examples of an encapsulated IC that may include an antenna within the encapsulation material.

FIG. 13 is an isometric view of an encapsulated IC 1300 that may include an antenna 1360 within the encapsulation material 1310. In this example, PBG structure 1350 may provide EMI shielding from stray EMI signals 1351, as described above in more detail.

Antenna 1360 may be a dielectric resonator antenna that may be formed with two different permittivity materials. In this example, region 1360 may have a first permittivity er1 and region 1350 may have a second permittivity er2. A single bulk material with different lattices may be used to create "effective er1," "effective er2," etc. to create the same effect.

In this example, region 1350 may also be configured as a PBG to both create an EMI shield and to form dielectric resonator antenna 1360 to radiate and/or receive radio frequency (RF) signals 1361. These RF signals may be generated/received by RF circuitry that is located on IC die 1302 and coupled to dielectric resonator antenna 1360 via signal line 1362, for example. In this example, the frequency of RF signals 1361 may be outside the bandgap range provided by PBG structure 1350 and therefore are able to propagate through PBG structure 1350 with no or little signal loss.

Figure 14:
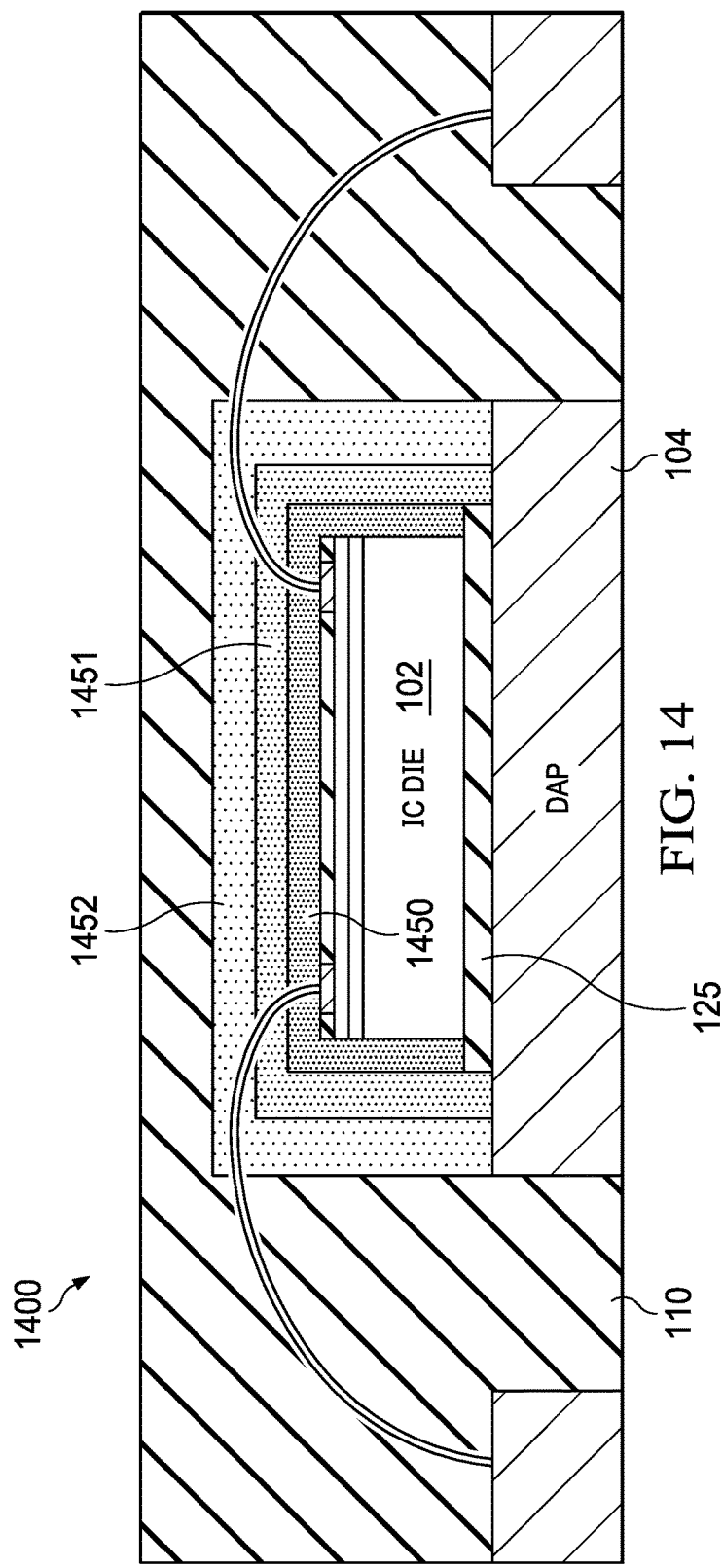
FIG. 14 is a cross sectional view of an example encapsulated IC that includes several layers of bandgap material.

FIG. 14 is a cross sectional view of an example encapsulated IC 1400 that includes several layers of bandgap material, 1450, 1451, 1452. In this example, three layers are illustrated, but in other embodiments additional layers may be included. Each layer 1450-1452 may be designed to have a different bandgap frequency range so that the combination of layers may provide an EMI shield that can block a larger range of frequencies than a single layer PBG structure.

Thus, in embodiments of this disclosure an IC die may be protected from external sources of EMI or may be prevented from spreading EMI to adjacent devices in a similar manner to using a Faraday cage but without the need to use a metallic conductor. Metallic shields may have issues with corrosion, cost, etc.

PBG EMI shields may be frequency selective so that a selective range or multiple ranges of frequencies may be blocked while a selected range or multiple ranges of frequencies may be allowed to pass through.

Other Embodiments

While the disclosure has been described with reference to illustrative embodiments, this description is not intended to be construed in a limiting sense. Various other embodiments of the disclosure will be apparent to persons skilled in the art upon reference to this description. For example, in some embodiments, the lattice material may have a relatively low dielectric constant value and the node material may have relatively high dielectric constant value. In other embodiments, the lattice material may have relatively high dielectric constant value and the node material may have a relatively low dielectric constant value. In some embodiments, the node material may be air, another gas, or a vacuum, for example.

While PBG structures using materials with different permittivities were described herein, other embodiments may use materials having differences in other intrinsic properties, such as permeability, conductivity, etc.

In some embodiments, a portion of the nodes may be formed with one kind of material, while another portion of the nodes may be formed with a different material. Several different types of material may be used to form different sets of nodes within the photonic bandgap structure to thereby tailor the performance of the photonic bandgap structure.

In some embodiments, a portion of the nodes may be formed with one lattice constant, while another portion of the nodes may be formed with a different lattice constant. Several different lattice constants may be used to form different sets of nodes within the photonic bandgap structure to thereby tailor the performance of the photonic bandgap structure The nodes may be fabricated using various materials, such as: various polymers such as polyurethane, polyacrylates, etc., ceramic materials, metals, gases such as natural air, nitrogen etc. In some cases, a vacuum may be left and therefore no material would be used for some lattice nodes.

In some embodiments, the PBG structure may be symmetric in 3D, while in other embodiments the PBG structure may be asymmetric with different lattice spacing in different directions.

In some embodiments, the PBG structure may have a bandgap that is effective in all directions, while in other embodiments the PBG structure may have a bandgap in one direction but not in another direction, for example.

in another embodiment, an IC die may be partially or completely surrounded by a photonic bandgap structure in the form of an enclosure that surrounds the IC, such as a box shaped or spherical shaped enclosure that is formed within the encapsulation material by selective placement of nodes within the encapsulation material.

Another embodiment may include packages that are entirely encased in mold compound, such as a dual inline package (DIP).

In another embodiment, the PBG structure may be made with ferroelectric or magnetic material. In this case, a field bias may be applied to the PBG structure using coils or plates located on the IC die or adjacent to the IC die to tune the bandgap. The amount of bias may be controlled by control circuitry located on the IC die, or by control circuitry that is external to the IC die.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A device comprising:
an integrated circuit (IC) die;
an encapsulation material encapsulating the IC die;
a photonic bandgap (PBG) structure within the encapsulation material, the PBG structure configured to have a photonic bandgap frequency range approximately equal to a range of electromagnetic interference (EMI) frequencies, the PBG structure forming an EMI shield around at least a portion of the IC die; and
a radio frequency (RF) circuit fabricated on the IC die, the RF circuit configured to produce a first frequency within the photonic bandgap frequency range.

2. The device of claim 1, wherein the PBG structure includes a matrix of periodically spaced nodes within the encapsulation material, the encapsulation material has a first permittivity, and the nodes have a second permittivity that is different from the first permittivity.

3. The device of claim 2, wherein the second permittivity is greater than the first permittivity.

4. The device of claim 1, wherein the PBG structure includes a diffusion of particles within the encapsulation material, the encapsulation material has a first permittivity, and the particles have a second permittivity that is different from the first permittivity.

5. A device comprising:
an integrated circuit (IC) die;
an encapsulation material encapsulating the IC die;
a photonic bandgap (PBG) structure within the encapsulation material, the PBG structure configured to have a photonic bandgap frequency range approximately equal to a range of electromagnetic interference (EMI) frequencies, the PBG structure forming an EMI shield around at least a portion of the IC die; and
a circuit fabricated on the IC die, the circuit having an operation susceptible to an electromagnetic interference (EMI) frequency within the photonic bandgap frequency range.

6. The device of claim 5, further comprising:
a radio frequency (RF) circuit fabricated on the IC die, the RF circuit configured to transmit or receive at a transmission frequency; and
an antenna structure coupled to the RF circuit.

7. The device of claim 5, wherein the PBG structure includes a matrix of periodically spaced nodes within the encapsulation material, the encapsulation material has a first permittivity, and the nodes have a second permittivity that is different from the first permittivity.

8. The device of claim 7, wherein the second permittivity is greater than the first permittivity.

9. The device of claim 5, wherein the PBG structure includes a diffusion of particles within the encapsulation material, the encapsulation material has a first permittivity, and the particles have a second permittivity that is different from the first permittivity.

10. A device comprising:
an integrated circuit (IC) die;
an encapsulation material encapsulating the IC die;
a photonic bandgap (PBG) structure within the encapsulation material, the PBG structure configured to have a photonic bandgap frequency range approximately equal to a range of electromagnetic interference (EMI) frequencies, the PBG structure forming an EMI shield around at least a portion of the IC die;
a radio frequency (RF) circuit fabricated on the IC die, the RF circuit configured to transmit or receive at a transmission frequency outside the photonic bandgap frequency range; and
an antenna structure adjacent the IC die, the antenna structure coupled to the RF circuit.

11. The device of claim 10, wherein the PBG structure includes a matrix of periodically spaced nodes within the encapsulation material, the encapsulation material has a first permittivity, and the nodes have a second permittivity that is different from the first permittivity.

12. The device of claim 11, wherein the second permittivity is greater than the first permittivity.

13. The device of claim 10, wherein the PBG structure includes a diffusion of particles within the encapsulation material, the encapsulation material has a first permittivity, and the particles have a second permittivity that is different from the first permittivity.

14. A device comprising:
an integrated circuit (IC) die;
an encapsulation material encapsulating the IC die, the encapsulation material including a first portion having a first permittivity (er1) and a second portion having a second permittivity (er2), the first portion surrounded by the second portion to form a dielectric resonator antenna;
a photonic bandgap (PBG) structure within the encapsulation material, the PBG structure configured to have a photonic bandgap frequency range approximately equal to a range of electromagnetic interference (EMI) frequencies, the PBG structure forming an EMI shield around at least a portion of the IC die; and
a radio frequency (RF) circuit fabricated on the IC die, the RF circuit coupled to the dielectric resonator antenna, and the RF circuit configured to transmit or receive at a transmission frequency.

15. The device of claim 14, wherein the PBG structure is formed within the second portion.

16. The device of claim 14, wherein the PBG structure includes a matrix of periodically spaced nodes within the encapsulation material, the encapsulation material has a first permittivity, and the nodes have a second permittivity that is different from the first permittivity.

17. The device of claim 16, wherein the second permittivity is greater than the first permittivity.

18. The device of claim 14, wherein the PBG structure includes a diffusion of particles within the encapsulation material, the encapsulation material has a first permittivity, and the particles have a second permittivity that is different from the first permittivity.

19. A device comprising:
an integrated circuit (IC) die;
an encapsulation material encapsulating the IC die;
a photonic bandgap (PBG) structure within the encapsulation material, the PBG structure configured to have a photonic bandgap frequency range approximately equal to a range of electromagnetic interference (EMI) frequencies, the PBG structure forming an EMI shield around at least a portion of the IC die; and
a leadframe with a die attach pad, in which a portion of the PBG structure is located between the IC die and the die attach pad.

20. The device of claim 19, wherein the PBG structure includes a matrix of periodically spaced nodes within the encapsulation material, the encapsulation material has a first permittivity, and the nodes have a second permittivity that is different from the first permittivity.

21. The device of claim 20, wherein the second permittivity is greater than the first permittivity.

22. The device of claim 19, wherein the PBG structure includes a diffusion of particles within the encapsulation material, the encapsulation material has a first permittivity, and the particles have a second permittivity that is different from the first permittivity.

23. A device comprising:
an integrated circuit (IC) die;
an encapsulation material encapsulating the IC die;
a photonic bandgap (PBG) structure including a diffusion of particles within the encapsulation material, the PBG structure configured to have a photonic bandgap frequency range approximately equal to a range of electromagnetic interference (EMI) frequencies, the PBG structure forming an EMI shield around at least a portion of the IC die, the encapsulation material having a first permittivity, and the particles having a second permittivity that is different from the first permittivity; and
a die attach pad on which the IC die is mounted;
the PBG structure including a layer between the IC die and the die attach pad.

* * * * *